United States Patent [19]

Noren et al.

[11] Patent Number: 4,996,282

[45] Date of Patent: Feb. 26, 1991

[54] CATIONICALLY CURABLE POLYURETHANE COMPOSITIONS HAVING VINYL ETHER FUNCTIONALITY

[75] Inventors: Gerry K. Noren, Hoffman Estates; John J. Krajewski, Wheeling; Edward J. Murphy, Mt. Prospect, all of Ill.

[73] Assignee: DeSoto, Inc., Des Plaines, Ill.

[21] Appl. No.: 404,652

[22] Filed: Sep. 8, 1989

Related U.S. Application Data

[63] Continuation-in-part of Ser. No. 172,430, Mar. 24, 1988, abandoned, and Ser. No. 251,782, Oct. 3, 1988, abandoned.

[51] Int. Cl.$^5$ .............................................. C08G 18/04
[52] U.S. Cl. .................................. 528/75; 204/157.82; 252/182.22; 252/182.26
[58] Field of Search ..................... 528/75; 252/182.22, 252/182.26; 204/157.82

[56] References Cited

U.S. PATENT DOCUMENTS

| | | | |
|---|---|---|---|
| 4,472,019 | 9/1984 | Bishop et al. | 350/96.3 |
| 4,749,807 | 6/1988 | Lapin et al. | 560/91 |
| 4,751,273 | 6/1988 | Lapin et al. | 525/455 |

*Primary Examiner*—Maurice J. Welsh
*Attorney, Agent, or Firm*—Dressler, Goldsmith, Shore, Sutker & Milnamow, Ltd.

[57] ABSTRACT

A cationically curable polyurethane composition comprises the reaction product of an organic polyisocyanate with a transvinylation polyhydric alcohol mixture containing hydroxy groups. The polyisocyanate consumes substantially all of the available hydroxy groups in the transvinylation polyhydric alcohol mixture. These compositions are particularly useful in stereolithography. A method of transvinylation utilizing ultrasonic energy is also disclosed.

38 Claims, No Drawings

CATIONICALLY CURABLE POLYURETHANE COMPOSITIONS HAVING VINYL ETHER FUNCTIONALITY

CROSS-REFERENCE TO RELATED APPLICATIONS

This application is a Continuation-in-Part of U.S. application Ser. No. 172,430 filed Mar. 24, 1988 and U S. application Ser. No. 251,782 filed Oct. 3, 1988 both abandoned.

TECHNICAL FIELD

This invention relates to radiation-curable polyurethane compositions having vinyl ether functionality. The compositions are produced by reacting a polyisocyanate and a transvinylated polyhydric alcohol mixture that includes unreacted, partially transvinylated and fully transvinylated polyhydric alcohols. A method of producing the transvinylation mixture is also disclosed.

BACKGROUND OF THE INVENTION

Compositions that are radiation-curable have many uses. For example, it is known, as illustrated in U.S. Pat. No. 4,575,330 to C. W. Hull, to form three-dimensional objects of complex shape using ultraviolet light, such as that from a laser beam, to solidify superposed layers of a liquid ultraviolet-curable ethylenically unsaturated acrylate or methacrylate based material at the surface of a liquid reservoir of such material. Thin-walled objects, usually of honeycomb character, are formed in this manner. This method of producing objects is known as "stereolithography".

The ultraviolet dosage is limited to speed the process and limit the depth of polymerization to the layer being solidified. Even when the thin-walled object is incompletely cured and has inadequate strength and durability, the process is relatively slow because acrylate-functional materials do not respond very rapidly and the available ultraviolet lasers are weak and lose power rapidly.

More particularly, the solid objects produced by known stereolithographic processes are formed by the ultraviolet polymerization of a liquid ultraviolet-curable ethylenically unsaturated material which is acrylate or methacrylate based. Such materials have many disadvantages other than their relatively slow cure, and among these are dimensional instability on partial cure, shrinkage on cure and also their irritating effects on humans.

The ultraviolet dosage required for partial cure of the layers typically used in the Hull process, namely: those having a thickness, i.e. depth of cure, of from 1 to 10 mils, is in the range of 1 to 15 Joules per square centimeter. This is a significant amount of energy when one considers that the material has only been transformed from a flowable liquid into a lightly cross-linked solvent-swellable three-dimensional polymeric thin-walled element.

These photoformed objects are somewhat gelatinous and mechanically weak due to the low degree of cross-linking and the presence of unconverted monomers and oligomers (which are still unsaturated) within the partially polymerized polymeric structure of the object. As a result of the incomplete consumption of the ethylenic unsaturation, problems arise as how to more completely cure (thermoset) these objects after they have been removed from the bath of liquid ultraviolet-curable ethylenically unsaturated material in which they were formed.

Moreover, in removing the photoformed objects from the liquid (meth)acrylates from which they are formed, it is hard to avoid human contact with these liquids or their vapors which are toxic, odorous and irritating.

It is important to note that polymerization does not continue after the ultraviolet exposure ceases. Additionally, a more extensive ultraviolet-cure of the initially formed polymeric object is not entirely satisfactory because the ultraviolet light has difficulty penetrating into the interior of the solid objects under consideration.

A radiation-curable liquid composition which is not (meth)acrylate based and which will fully cure where polymerization is initiated without requiring an additional curing step or mechanism is highly desirable. The present invention provides such a composition, and it does so in a particularly convenient fashion using vinyl ether polyurethane compositions.

Vinyl ether-terminated polyurethanes are described in Bishop, Pasternack and Cutler U.S. Pat. No. 4,472,019 and also in Lapin and House U.S. Pat. No. 4,751,273 which issued on June 14, 1988. In each of these patents the vinyl ether-terminated polyurethane is formed by the reaction of an aliphatic monohydric vinyl ether with a diisocyanate.

In the Lapin and House disclosure, the monohydric vinyl ether is formed by a reaction of a polyol with acetylene in the presence of potassium hydroxide at elevated temperature and pressure. That reaction method significantly limits the vinyl ethers which can be produced because potassium hydroxide degrades some materials, such as ester groups, and interferes with the subsequent reaction with isocyanate. Also, and while it is broadly disclosed that one may react the diisocyanate with the monohydric vinyl ether in the presence of the other components of the reaction mixture, these other components are normally separated from the desired monohydric vinyl ether by distillation. Indeed, at least some of these other components of the reaction mixture are necessarily separated from the monohydric vinyl ether product by distillation when the desired products of reaction are separated from the potassium hydroxide catalyst by distillation.

The Lapin and House patent also employs a 1:1 stoichiometry of hydroxy and isocyanate groups, albeit in some instances it is indicated to be desirable to use a slight excess of hydroxy vinyl ether to ensure the complete reaction of the isocyanate functionality. Accordingly, if the reaction is not pushed to cause it to be complete, or if excess hydroxy vinyl ether is employed, the polyurethane product will include small amounts of unreacted hydroxy functionality. This unreacted hydroxy functionality disturbs the cationic cure in the present invention when the cationic photoinitiator concentration is very low, as is important to the formation of the relatively thick layers, i.e., layers having a depth of cure greater than about 1 mil, which are contemplated herein for uses such as stereolithography.

Lapin and House disclose the production of only one hydroxy vinyl ether, namely: triethylene glycol monovinyl ether. This distilled product is stated to have been obtained with a purity of 95 percent, so polyhydric materials have substantially been eliminated. It is this relatively pure mixture which is reacted at room temperature with a stoichiometric proportion of either 2,4-toluene diisocyanate or diphenylmethane diisocyanate, the reaction being carried out by simply stirring the mixture and the diisocyanate in the presence of dibutyl tin dilaurate catalyst for up to 5 hours without extraneous heat. As a result, the substantial elimination of hydroxy functionality is not assured. Cure is disclosed using various radiation sources. When ultraviolet light is used for cure, the coating is merely indicated to be "thin" and to have cured to produce "a tack-free glossy coating" when 4 percent of a triaryl sulfonium salt is used as the catalyst. The present invention intends to achieve far more than merely obtaining a tack-free glossy surface on a very thin film, i.e., a film having a depth of cure equal to or less than about 1 mil, as will be apparent from the discussion which follows.

Lapin and House also emphasize the production of low molecular weight divinyl ether-terminated polyurethanes. Thus, while polyols containing more than two hydroxy groups per molecule are mentioned, diols are stressed and are the only materials used in the examples. In Lapin and House, there is no contemplation of vinyl ethers in which more than two vinyl ether groups are present on the polymer which is formed.

In the present invention it is desired to obtain tough films by using higher molecular weight compositions. Higher molecular weight is preferably obtained in the present invention by having the polyurethane oligomer contain a plurality of internal urethane groups. The toughness of the cured films produced from the present compositions is also enhanced by providing vinyl ether polyurethane compositions having an average vinyl ether functionality in excess of 2.0.

Thus, and for many reasons, Lapin and House does not provide ultraviolet-curable compositions of interest to the production of the elastomeric coatings or layers which are contemplated herein. There are also many other limitations in the Lapin and House disclosure which are overcome by this invention.

Conventional compositions that utilize hydroxy vinyl ethers utilize hydroxy vinyl ethers that are highly purified, i.e., have a very high concentration of the particular hydroxy vinyl ether. These highly purified hydroxy vinyl ethers are costly to produce. Conventional methods of producing these hydroxy vinyl ethers require elevated temperatures and pressures and/or require a long reaction period.

DISCLOSURE OF INVENTION

The present invention contemplates a cationically curable polyurethane composition that is capable of forming a film which is tack-free and tough after actinic radiation exposure in the presence of a cationic photoinitiator. The polyurethane composition is the reaction product of an organic polyisocyanate, preferably a diisocyanate (especially a diphenylalkane diisocyanate in which the alkane group contains 1 to 8 carbon atoms), with a transvinylated polyhydric alcohol mixture containing hydroxy groups that is the transvinylation reaction product of (1) at least one vinyl ether and (2) at least one polyhydric alcohol having an average of more than 2 hydroxy groups per molecule. The polyisocyanate is present in an amount effective to consume substantially all of the available hydroxy groups in the transvinylation mixture. A photoinitiator for cationic polymerization can also be present in the composition, or it can be added to the composition shortly prior to use.

The term "transvinylation", as used in its various grammatical forms, means that the vinyl ether group of the vinyl ether and the hydroxy group of the alcohol are exchanged.

The terms "transvinylation mixture" and "transvinylation polyhydric alcohol mixture", as used in their various grammatical forms, mean unreacted polyhydric alcohol, partially transvinylated polyhydric alcohol and fully transvinylated polyhydric alcohol are present in the transvinylation reaction product of the vinyl ether and the polyhydric alcohol. The transvinylation mixture is preferably, but not necessarily, an equilibrium mixture.

The transvinylated aliphatic polyhydric alcohol mixture can contain partially vinylated polyhydric alcohol and at least about 3 percent to about 90 percent by weight of unreacted polyhydric alcohol. The polyisocyanate consumes substantially all of the available hydroxy functionality. Simple monohydric alcohols (which are formed when a $C_1$ to $C_4$ alkyl vinyl ether is used) are preferably removed to provide a transvinylation mixture which is substantially free of simple monohydric alcohols. Such alcohols function to terminate the polyurethane oligomer of the polyurethane composition which is formed, an action which is undesirable, but tolerable in some instances.

The term "simple monohydric alcohol", as used in its various grammatical forms, is a short chain alcohol containing 1 to 4 carbon atoms and having only one hydroxy group per molecule.

The transvinylated mixture is produced by transvinylating a vinyl ether with at least one polyhydric alcohol component which preferably contains an average of more than 2 hydroxy groups per molecule, whereafter any simple monohydric alcohol by-product of the transvinylation reaction and the transvinylation catalyst are normally removed. More particularly, the cationically curable polyurethane compositions of this invention utilize the transvinylation reaction product of an arylalkyl polyhydric alcohol, which most preferably contains or consists of polyhydric alcohols having an average of 3 or more hydroxy groups per molecule, and a vinyl ether which can contain one or more vinyl ether groups per molecule. The transvinylated reaction product contains partially transvinylated polyhydric alcohols as well as unreacted polyhydric alcohols, and it can also contain fully transvinylated polyhydric alcohols.

The transvinylation reaction is conveniently carried out in the presence of a catalyst that is known for use in this reaction. While it is not essential, the catalyst and the simple monohydric alcohol by-products of the reaction can both be optionally removed, and this usually also removes any unreacted monovinyl ether which may be present.

It is desired to point out that the catalyst is conventionally removed by filtration, which is a particularly simple operation. Any simple monohydric alcohols and any unreacted monovinyl ether which can be present when a monovinyl ether is used in the transvinylation reaction are highly volatile and easily removed by evaporation out of the reaction product. Thus, the removal of the above-noted easily removed components leaves the balance of the transvinylation reaction product intact. This present method of operation eliminates the need to distill off the desired monohydric vinyl ether utilized in conventional compositions, and whatever comes along with this monohydric vinyl ether, from the potassium hydroxide catalyst used in the reaction with acetylene. The distillation step utilized in the prior art is a difficult operation involving elevated temperature which causes undesired side reactions.

The catalyst utilized herein is a conventional transvinylation catalyst and is illustrated by the elements of Groups IB, IIB, IVB, VB, VIB, VIIB, and VIII of the Periodic Table of Elements. Representative catalysts include palladium, mercury, copper, zinc, magnesium, cobalt, mercuric acetate, mercury (II) salts, lithium chloropalladite (I) dialkylpyridines, phosphates of thallium, vanadium, chromium, manganese, iron, cobalt, and nickel, Group VI oxyacid salts and mixtures thereof. A presently preferred catalyst is palladium (II).

The catalyst used herein can be a finely divided powder and can be removed by filtration. The addition of charcoal to the mixture can assist the filtration process, e.g., when a finely divided powder form of the catalyst is utilized. The simple monohydric alcohol and any volatile alkyl monovinyl ether which are present when an alkyl monovinyl ether is used for transvinylation are preferably removed by vaporization, and this is conveniently performed when methyl or ethyl vinyl ethers are used by applying a reduced pressure to the reaction product at room temperature, i.e., a temperature of about 20° to about 30° C. It is desired to restrict the purification operation to simple filtration, and this is done herein by using a polyvinyl ether, such as a divinyl ether of a diol illustrated by triethylene glycol divinyl ether, as a transvinylation reactant.

The catalyst can be bound to a solid matrix such as charcoal, nickel, alumina, ion exchange resins, molecular sieves, zeolites, or similar materials. The solid matrix having catalyst bound thereto can be in the shape of beads, filings, part of the walls of a column, and the like. Alternatively, the solid matrix having catalyst bound thereto can be packed in a column.

The product of the transvinylation reaction is a mixture containing partially transvinylated polyhydric alcohols. Accordingly, there is present on these partially transvinylated polyhydric molecules at least one vinyl ether group and at least one hydroxy group, so the transvinylation mixture tends to deteriorate with time and exposure to elevated temperature, at least partially by the formation of acetal groups. By significantly reducing the hydroxy content by reaction with a polyisocyanate in accordance with this invention, this deterioration is minimized or largely avoided. Prior to reaction with polyisocyanate, the present invention's elimination of the prior art3 s use of an elevated temperature distillation operation also minimizes this deterioration of the transvinylation mixture.

Separation of the monohydric vinyl ether, and whatever compounds are separated along with this monohydric vinyl ether, from the potassium hydroxide catalyst by distillation, as taught by Lapin and House, requires elevated temperature which enhances acetal formation and deterioration. Distillation to separate the product, i.e., the monohydric vinyl ether, from the catalyst was essential because the potassium hydroxide interferes with subsequent reaction of the product with isocyanate. Unreacted polyols containing at least 3 hydroxy groups and some diols have high boiling temperatures. Removal of these polyols and diols by distillation would result in enhanced acetal formation and deterioration of the product because of the high temperature required. As a result, relatively little diol is present in the distillate product of Lapin and House, and even that is normally removed. The use of polyhydric alcohols containing ester groups or other groups which degrade in the presence of caustic, e.g., potassium hydroxide, is also prevented in Lapin and House.

The transvinylation mixture will normally contain some unreacted polyhydric alcohol and some fully vinylated polyvinyl alcohol, as previously indicated, and these are not removed in this invention. This introduces an important economy at the same time that it enables one to increase the molecular weight and the vinyl ether functionality by reaction of the transvinylation mixture with organic polyisocyanates. Increased molecular weight, the presence of internal urethane or urea groups, and the increased vinyl ether functionality all introduce physical toughness into the products produced by the cationic cure of the vinyl ether polyurethane compositions which are produced herein.

In preferred practice, the partially transvinylated polyhydric alcohol in this invention contains from 3 percent to 25 percent of unreacted polyhydric alcohols, about 30 to about 94 percent partially vinylated polyhydric alcohols, and from 3 percent to 25 percent of fully vinylated polyhydric alcohols. This is particularly preferred when the polyhydric alcohols which are transvinylated contain 3 or 4 hydroxy groups.

The transvinylation reaction to produce vinyl ethers is itself known, and illustrative articles describing this reaction using alkyl vinyl ethers are, McKeon et al, "The Palladium (II) Catalyzed Vinyl Interchange Reaction—I", *Tetrahedron* 28:227–232 (1972) and McKeon et al., "The Palladium (II) Catalyzed Vinyl Interchange Reaction—II", *Tetrahedron* 28:233–238 (1972). However, these articles teach purifying the reaction product and do not suggest the use of a transvinylation mixture.

A method of synthesizing pure vinyl ethers is disclosed in Smith et al., "A Facile Synthesis of Low and High Molecular Weight Divinyl Ethers of Poly(oxyethyrene)", *Polymer Preprints* 28(2):264–265 (August, 1987). Smith teaches the synthesis of pure vinyl ethers using transetherification chemistry based on the palladium (II) catalysts of poly(oxyethylene) glycols and ethyl vinyl ether.

While the present invention can use a diol as the polyhydric alcohol, it preferably employs triols and tetrols (most preferably triols). Indeed, when diols are used the needed molecular weight and/or presence of internal urethane groups makes it necessary to add some higher functional polyol to the mixture which is transvinylated or to the transvinylation mixture which is reacted with diisocyanate. Suitable higher functional polyols include the triols and higher hydroxy functional polyols referred to herein. Thus, the polyhydric alcohol can be a mixture of alcohols and has an average hydroxy functionality per molecule of more than 2.

Moreover, this invention forms unrefined transvinylation mixtures which are further reacted to enhance stability of the transvinylation mixture by the formation of liquid polyurethane compositions in which the molecular weight and vinyl ether functionality are both increased. While Lapin and House includes the possibility of using a polyhydric alcohol containing more than two hydroxy groups in the transvinylation and also the possibility of using an unrefined distillate, the use of both at the same time is never suggested. Also, unreacted polyhydric alcohol containing more than two hydroxy groups would not normally be present in the unrefined distillate because of the very high boiling point of the polyhydric alcohols.

Suitable polyhydric alcohols for use in this invention can be arylalkyl or aliphatic polyhydric alcohols having an average of more than 2, preferably at least 3, hydroxy groups per molecule on the aliphatic or alkyl portion thereof. Presently, the polyhydric alcohols can have up to about an average of about 10 hydroxy groups per molecule.

The polyhydric alcohol utilized is preferably soluble in the vinyl ether and has a number average molecular weight of up to about 2,000 daltons. We preferably employ polyhydric alcohols that are liquid at room temperature, i.e., a temperature of about 20° to about 30° C., or which (if solid) have a number average molecular weight below about 400 daltons.

The term "dalton", as used in its various grammatical forms, defines a unit of mass that is $1/12^{th}$ the mass of carbon-12.

The alkyl group of these arylalkyl polyhydric alcohols preferably contains about 2 to about 10, more preferably about 3 to about 6, carbon atoms. The aryl group of these polyhydric alcohols preferably contains up to about 20, more preferably up to about 10, carbon atoms. Illustrative arylalkyl polyhydric alcohols include ethoxylated polyhydric phenols, hydroxy substituted ring structures, e.g. phenol, naphthol, and the like, that are alkoxylated, trimethylol benzene, and the like, and mixtures thereof.

Preferred polyhydric alcohols are aliphatic polyhydric alcohols that contain 2 to 10 carbon atoms, more preferably 3 to about 6 carbon atoms, and are illustrated by ethylene glycol, butylene glycol, ester diol, 1,6-hexane diol, glycerol, trimethylol propane, pentaerythritol, and sorbitol. Trimethylol propane is particularly preferred.

The polyhydric alcohol can be a polyether, such as the ethylene oxide or propylene oxide adducts of the polyhydric alcohols noted previously. These are illustrated by the propylene oxide adduct of trimethylol propane having a number average molecular weight of about 1500 daltons.

The polyhydric alcohol can also be a polyester of the polyhydric alcohols noted previously, such as the reaction product of trimethylol propane with epsilon caprolactone having a number average molecular weight of about 600 and the reaction product of two moles of ethylene glycol with one mole of adipic acid.

Still other polyhydric alcohols are illustrated by resinous materials which contain hydroxy groups, such as styrene-allyl alcohol copolymers, acrylic copolymers containing 2 percent to 20 percent of copolymerized 2-hydroxyethyl acrylate, and even starch or cellulose. However, these have a higher hydroxy functionality than is now preferred.

The polyhydric alcohol can also be amine substituted, e.g., triethylamine.

It is desired to stress that the reaction with acetylene utilized in the prior art is not applicable to many of the polyhydric alcohols which are particularly attractive for use in the present invention. Polyesters and polycarbonates, such as 1,6-hexane polycarbonate having a molecular weight of about 1,000 daltons, are degraded by the potassium hydroxide catalyst used in reaction with acetylene, but can be transvinylated in accordance with this invention.

Suitable vinyl ethers can be represented by the following general formula:

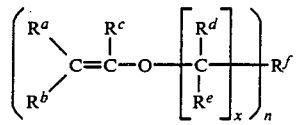

wherein $R^a$, $R^b$, $R^c$, $R^d$, and $R^e$ are each independently selected from the group of hydrogen and lower alkyl containing 1 to 4 carbon atoms and $R^a$ or $R^b$ and $R^c$ can be joined together to form part of a ring structure; $R^a$ or $R^b$ and $R^d$ or $R^e$ can be joined together to form part of a ring structure; and $R^c$ and $R^d$ or $R^e$ joined together can be part of a ring structure; $R^f$ is an aromatic or aliphatic group that is only reactive at the site(s) where a vinyl ether containing radical is bound; x is 0 or 1; and n is equal to 1 to 10 with the proviso that n is less than or equal to the number of reactive sites of $R^f$.

$R^f$ can contain heteroatoms, i.e., atoms other than carbon atoms, such as oxygen, nitrogen, sulfur, silicon, phosphorus, and mixtures of heteroatoms alone or in combination with carbon atoms. $R^f$ can contain 1 to about 20, preferably 1 to about 10, atoms. $R^f$ is preferably a straight or branched carbon containing group containing 1 to about 8, more preferably 1 to about 4 carbon atoms and can contain oxygen atoms. A preferred range for n is 1 to about 4.

Representative of vinyl ethers of formula I are dihydropyran and dimethyl benzene divinyl ether.

Preferred vinyl ethers for use in the transvinylation reaction can be represented by the following general formula:

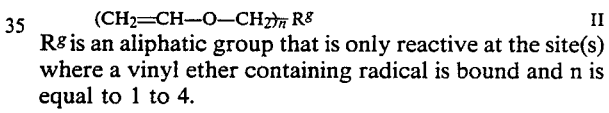

$R^g$ is an aliphatic group that is only reactive at the site(s) where a vinyl ether containing radical is bound and n is equal to 1 to 4.

$R^g$ contains at least one carbon atom and can contain heteroatoms and mixtures of heteroatoms. Preferably, $R^g$ can contain 1 to about 4 atoms and can contain oxygen atoms.

Vinyl ethers having the structure of formula II are illustrated by divinyl ethers, such as 1,4-butane diol divinyl ether, 1,6-hexane diol divinyl ether, and triethylene glycol divinyl ether. Polyvinyl ethers of higher functionality are illustrated by trimethylol propane trivinyl ether and pentaerythritol tetravinyl ether.

Illustrative monovinyl ethers having the structure of formula II are ethyl vinyl ether, methyl vinyl ether, n-butyl vinyl ether, and the like, including phenyl vinyl ether. The presently preferred monovinyl ether is ethyl vinyl ether which releases ethanol on reaction.

The equivalent ratio of the vinyl ether to the hydroxy groups in the polyhydric alcohol is in the range of about 0.5:1 to about 5:1, preferably 0.8:1 to 2:1. Possibly of greater significance, the polyhydric alcohol is transvinylated to react with from 10 percent to 90 percent, preferably from 30 percent to 80 percent, of the hydroxy groups which are present thereon. The higher the functionality of the polyhydric alcohol, the higher the proportion of hydroxy groups thereon which should be reacted by transvinylation.

As previously disclosed, a palladium (II), catalyst can be utilized. Illustrative catalysts are $PdCl_2$, $(PhCN)_2PdCl_2$, diacetato-(2,2'-bipyridyl)palladium (II), diacetato-(1,10-phenanthroline)palladium (II), diacetato-(N,N,N',N'-tetramethylenediamine)palladium (II), diacetato(P,P',P',P'-tetraphenyl-1,2-di-phosphino-ethane) palladium (II), and the like. Diacetato-(1,10-phenanthroline)-palladium (II) is a preferred palladium (II) catalyst.

The catalyst is usually present in a range of about 0.001 to about 1 percent, preferably about 0.1 percent, by weight based on the total weight of the polyhydric alcohol and vinyl ether.

The transvinylation reaction is a conventional one, as previously indicated, and is described in the articles noted previously. We employ a closed vessel which is charged with the appropriate amounts of the polyhydric alcohol, vinyl ether and catalyst and the mixture is stirred and reacted at a temperature of from about room temperature up to about 45° C. The reaction proceeds slowly, and we usually permit it to proceed for an extended period of time up to about 3 days to obtain the desired equilibrium composition. After about 2 days we find that using a 20 percent stoichiometric excess of vinyl ether with respect to hydroxy functionality causes about half of the hydroxy groups to be consumed in the reaction.

A preferred method of performing the transvinylation reaction is to utilize ultrasonic energy to enhance the transvinylation. In this ultrasonic transvinylation method an admixture of the vinyl ether, the polyhydric alcohol and the catalyst is exposed to ultrasonic energy for a time period effective to produce the transvinylation mixture. The frequency of the ultrasonic energy is about 10 to about 850 kilohertz (kHz). The ultrasonic transvinylation reaction is preferably performed at room temperature and pressure, i.e., about one atmosphere.

An illustrative device for supplying ultrasonic energy is a Model B220 ultrasonic cleaner, commercially available from Branson Corp., Shelton, CT. This cleaner has 125 watts of power and provides a frequency of about 30 to about 50 kHz at this power level. In this method the reactants are placed into a suitable vessel which is then placed in the water bath of the cleaner. The cleaner is then activated to enhance the transvinylation reaction.

The transvinylation reaction can be run for a time period effective to obtain the desired transvinylation mixture. A method of determining if the desired transvinylation mixture has been obtained is to conventionally test samples by gas chromotography to determine the content of the transvinylation mixture.

After the transvinylation reaction is terminated, it is convenient to remove the catalyst by filtration, and the addition of about 1 percent by weight of charcoal can be helpful. We also prefer to strip off any volatile products which can be present, and this can be done by simply subjecting the reaction product to reduced pressure at room temperature. This removes any residual alkyl monovinyl ether and the simple monohydric alcohol by-product of the reaction, at least when methyl or ethyl vinyl ether is used. With higher monohydric alcohols, modest heat, i.e., heat to achieve a temperature of about 30° to about 60° C., can be used to help remove volatiles. While the filtration step is preferably carried out prior to removal of volatiles, this sequence can be reversed. When polyvinyl ethers are used, there is no need to subject the transvinylation reaction product to reduced pressure because there is no residual alkyl monovinyl ether or simple monohydric alcohol by-product present, and this is a feature of this invention.

It is preferred that the transvinylation polyhydric alcohol mixture be liquid at room temperature, but this is not essential since reactive liquid materials or diluents can be added, e.g., the aforementioned vinyl ethers such as ethyl vinyl ether or a polyvinyl ether such as ethylene glycol divinyl ether, to permit the further reactions contemplated herein to be carried out. Optionally, any residual alkyl monovinyl ether and simple monohydric alcohol by-product can be retained as a diluent, but this is usually undesirable since the monohydric alcohol is independently reactive with polyisocyanate and functions as a chain-terminating agent and limits the attainment of the desired molecular weight. Other conventional diluents, e.g., N-vinyl pyrrolidone, N-vinyl caprolactam, and the like can also be present.

The unreacted polyhydric alcohol and partially transvinylated polyhydric alcohol are then converted into a polyurethane oligomer (prepolymer), which is a component of the polyurethane composition, by reaction with the diisocyanate to form a polyurethane prepolymer having an average of more than 2, preferably more than about 2 to about 10, vinyl ether groups per molecule. The polyisocyanate is utilized in an amount effective to substantially eliminate unreacted hydroxy groups present in the transvinylation mixture. Therefore, the isocyanate consumes substantially all of the available hydroxy groups of the transvinylation mixture, i.e., less than about 0.1 percent by weight of hydroxy groups are present in the polyurethane composition. The cationic cure has been found to be inhibited by the presence of even about 0.1 percent by weight of hydroxy groups, so the elimination of hydroxy groups from the composition in any substantial amount is particularly important. Preferably the composition has a hydroxy number below about 10.

The reaction with organic polyisocyanate increases the number average molecular weight and the vinyl ether functionality of the resultant polyurethane composition. This is especially true to the extent that polyhydric alcohols having a hydroxy functionality in excess of 2 are used since this introduces branching or an increase in the number of vinyl ether or divinyl ether groups. While the polyisocyanate can have a functionality higher than two, it is preferred to react with diisocyantes because of their availability and also because this minimizes the tendency to gel when substantially all of the hydroxy functionality is consumed.

A stoichiometric excess of diisocyanate, based on hydroxy groups, can be used, but a stoichiometric proportion is preferred. Excess isocyanate groups, when present, can be later consumed by reaction with any isocyanate reactive group. Thus, one can post-react the excess isocyanate groups of the polyurethane composition with an alcohol or amine-functional reagent which can be monofunctional or polyfunctional depending upon whether a further increase in molecular weight or functionality is desired.

Any of a wide variety of organic polyisocyanates, alone or in admixture, can be utilized, diisocyanates alone or in admixture with one another preferably constituting all or almost all of this component. Representative diisocyanates include isophorone diisocyanate (IPDI), toluene diisocyanate (TDI), diphenylmethylene diisocyanate, hexamethylene diisocyanate, cyclohexylene diisocyanate, methylene dicyclohexane diisocyanate, 2,2,4-trimethyl hexamethylene diisocyanate, m-phenylene diisocyanate, 4-chloro-1,3-phenylene diisocyanate, 4,4'-biphenylene diisocyanate, 1,5-naphthylene diisocyanate, 1,4-tetramethylene diisocyanate, 1,6-hexamethylene diisocyanate, 1,10-decamethylene diisocyanate, 1,4-cyclohexylene diisocyanate, and polyalkyloxide and polyester glycol diisocyanates such as polytetramethylene ether glycol terminated with TDI.

Preferred diisocyanates are diphenylalkane diisocyanates in which the alkane group contains from 1 to 8 carbon atoms. These are particularly useful when the proportion of cationic photoinitiator is less than 1 percent which provides the best results when relatively thick films are subjected to a cationic cure. A preferred diisocyanate is 1,4-diphenylmethane diisocyanate.

In the reaction between hydroxy and isocyanate groups, it is preferred to employ a stoichiometric balance between hydroxy and isocyanate functionality and to maintain the reactants at an elevated reaction temperature of at least about 40° C. until the isocyanate functionality is substantially consumed. This also indicates the hydroxy functionality is similarly consumed. One can also use a small excess of isocyanate functionality, as noted previously, but it is still necessary to force the reaction with increased temperature to insure that the hydroxy content is less than 0.1 percent by weight because a greater hydroxy concentration retards the rapid cure which is desired.

It is desired to emphasize that cured films possessing increased toughness are important in this invention. This toughness is achieved in two ways herein, namely: by using vinyl ether polyurethane oligomers having an average vinyl ether functionality of more than 2, and by using polyurethane oligomers containing internal urethane groups.

Since diisocyanates are preferably used herein, this means that the polyhydric alcohol used should contain a proportion of polyol having at least three hydroxy groups. Using a triol as illustrative, transvinylation provides a monovinyl ether having two hydroxy groups, so when this is reacted with diisocyanate it provides vinyl ether functionality along the length of the oligomer. Transvinylation also provides a monohydric divinyl ether which acts as a capping agent. Such a capping agent supplies two vinyl ether groups wherever it appears in the polyurethane oligomer. Both of these triol derivatives increase the vinyl ether functionality of the vinyl ether polyurethane oligomers. Moreover, unreacted triol has the same function, for it provides three branches which must be capped by the vinyl ether-containing capping agent.

Further chain extension and hence increased molecular weight can be achieved by the addition of conventional chain extenders including amine functional chain extenders. Illustrative amine functional chain extenders include polyoxyalkylene amines and the Jeffamine line of products, commercially available from Jefferson Chemicals. If an amine functional chain extender is utilized, all of the amine functionality must be consumed because amine functionality interferes with the cationic cure.

A monohydric capping agent can also be present to prevent gellation. The use, and amount required, of this agent is conventional.

The internal urethane or urea groups are provided by the stoichiometry of the system. Subtracting the molar proportion of the monohydric capping agent, if such an agent is present, from the number of moles of diisocyanate, the equivalent ratio of hydroxy, and/or amine from the amine functional chain extender if one is utilized, to isocyanate in the unreacted diisocyanate can be about 1:1 and can be up to about 1.2:1. This ratio increases the molecular weight of the oligomer and it introduces internal urethane or urea groups therein.

Thickness, i.e., depth of cure, of the coating is important in this invention when utilized in a process like stereolithography that utilizes layers having a thickness of greater than 1 mil. The cured coatings for these processes preferably have a thickness of from 1 to 10 mils, preferably from 2.5 to 6 mils, and the layer which is exposed to radiation must be cured throughout its thickness. This depth of cure is difficult to achieve when the usually large proportions of cationic curing agent are used in combination with light in or near the ultraviolet range.

The resulting polyurethane composition is preferably a liquid. In some instances low viscosity liquids, e.g., fully vinylated polyhydric alcohols which participate in a cationic cure, are introduced into the polyurethane composition to reduce viscosity to enhance coating application. In stereolithography and the coating of optical glass fiber it is preferred to employ a polyurethane composition substantially free of easily volatile components, especially inert materials such as volatile solvents.

Unreacted isocyanate groups can be present in the polyurethane composition used for coating, but are preferably minimized to less than about 0.1 percent by weight. More particularly, the residual isocyanate content of the polyurethane composition obtained by reaction of the transvinylation mixture with polyisocyanate can be substantial when further reaction, e.g., reaction with an aforementioned amine chain extender is contemplated, but when the polyurethane composition is to be used for coating, it is preferred that there be no detectable isocyanate present.

The number average molecular weight of the polyvinyl-functional polyurethane oligomer which is produced is in the range of about 200 to about 20,000 daltons, preferably about 1,000 to about 10,000 daltons, and most preferably from 1,500 to 4,000 daltons.

Presently preferred polyurethane compositions comprise the reaction product of an organic diisocyanate with a transvinylation mixture containing hydroxy groups that is the transvinylation reaction product of a divinyl ether having the formula II, above, and at least one aliphatic polyhydric alcohol having an average of 3 or more hydroxy groups per molecule. The diisocyanate consumes substantially all of the available hydroxy groups of the transvinylation mixture. The equivalent ratio of vinyl ether to polyhydric alcohol is in the range of about 0.5:1 to about 5:1.

A cationic photoinitiator can then be admixed with the reaction product of the transvinylation mixture and the polyisocyanate. This cationic photoinitiator is conventional. It is preferred to have the active constituent of the cationic photoinitiator present in the range of about 0.1 weight percent to 6 weight percent, preferably about 2 to 4 weight percent, albeit excessive absorption of actinic light and darkening of the coating is encountered at the upper end of this range.

The cationic photoinitiators are themselves well known and available in commerce. They are typically illustrated by sulfonium compounds, but iodonium compounds are also known cationic photoinitiators, as are diazonium salt compounds. These compounds are used in the proportions which have been mentioned and which are more fully discussed hereinafter. A preferred, exemplary, cationic photoinitiator is the triphenylsulfonium salt of hexafluoro phosphate which is available in commerce from General Electric Co. under the trade designation UVE 1016. This commercial cationic photoinitiator is supplied as a 50 percent solution in propylene carbonate. The tiny amount of this volatile solvent introduced with the cationic photoinitiator is too small to disturb the essentially solvent-free character of the compositions used herein. The commercial cationic photoinitiator used in the examples herein is only 50 percent active, which indicates that 50 percent of the material used is constituted by a solvent, e.g., propylene carbonate, and only the active portion provides the desired catalyst.

The cationic cure is itself well known. Unreacted amines and carboxyl-functional compounds are known to be deleterious and hence there is no purpose in including them. It was not known that small amounts of hydroxy functionality would inhibit the cure of vinyl ether systems. It has now been found that the addition of 0.1 percent of hydroxy functionality by weight causes the cationic cure in this invention to be about 3 times slower than if that hydroxy functionality had not been added, and this will illustrate the importance of the absence of hydroxy functionality.

The proportion of the cationic photoinitiator is a curing effective amount preferably less than 6 weight percent of active constituent based on the weight of the unsaturated material subjected to polymerization. The more preferred proportion of the cationic photoinitiator is from 0.1 percent to 6 percent, most preferably from 2 to 4 percent, on the same weight basis. As previously indicated, the solvent used to bring the cationic photoinitiator into the composition is not included in calculating the above proportions.

It is desired to stress that typical compositions of this invention having the thicknesses discussed, after exposure to about 1.0 Joule per square centimeter or less of ultraviolet light, convert rapidly to incompletely polymerized cross-linked rigid solids. However, since photoinitiators adapted to catalyze a cationic cure are used, the cationic cure continues after the exposure ends. As a result, the compositions of this invention can thermoset adequately without further exposure or other treatment. Although further treatment can be utilized to accelerate the cure.

The wavelength of the ultraviolet light utilized to cure the present compositions is preferably about 200 to about 400 nanometers (nm).

Cure can also be achieved by mechanisms other than photocuring. Representative of these other mechanisms is curing by use of an acid catalyst at room temperature or at an elevated temperature.

A prime application of the above composition is in the production of stereolithographically formed elements where the reduced toxicity, rapid ultraviolet cure and self-cure after radiation exposure are especially important. In this application, the surface of a liquid bath of the composition is exposed to ultraviolet light using a Liconix Model 4240N helium-cadmium laser having an output of 15 milliwatts at 325 nanometers focused to a 350 micron diameter. The usual dosage is about 0.5 to about 1.0 Joule per square centimeter. Cure to a reasonably rigid solid can be effected at about 0.7 Joules per square centimeter. After the desired pattern is traced, the exposed layer is then covered with another layer of liquid resin, and the same or a different pattern of ultraviolet exposure is traced on the surface of this newly deposited layer. A typical layer has the thickness previously discussed. This process is repeated, layer after layer, to obtain the desired three-dimensional product.

The transvinylation mixture and the polyurethane compositions produced therefrom are also suitable for use in coatings for optical glass fibers, paper, foil, metal, cement, floors, and the like, and other applications.

Polymerization, once initiated, will continue until curing is reasonably complete, i.e. greater than 90% of the double bonds are reacted, but can optionally be accelerated by heating the formed product after it has been withdrawn from the liquid bath in which it was formed and after liquid clinging to the surface of the withdrawn product has been removed, as by draining and/or rinsing. Typical temperatures are in the range of about 200° F. to about 350° F. for about 5 to about 30 minutes.

The following Examples illustrate the present invention, it being understood that all parts are by weight, unless otherwise stated, and all molecular weights are by number average.

EXAMPLE 1

Production of the Transvinylation Polyhydric Alcohol Mixture Using a Monovinyl Ether A reaction vessel was charged with 44.7 grams (gm) of trimethylol propane, 115 milliliters (ml) of ethyl vinyl ether and 0.1 percent by weight of a palladium (II) catalyst in the form of a finely divided powder. The equivalent ratio of ethyl groups in the ethyl vinyl ether to the hydroxy groups of the trimethylol propane was 1.2:1. The reaction mixture was stirred at room temperature and did not exceed a temperature of 40° C. since at about that temperature the volatile components present (unreacted ethyl vinyl ether and ethanol) vaporize and these were captured in an overhead condenser and returned to the reaction vessel.

At the end of the reaction, i.e., 72 hours, 1 percent by weight of charcoal was added and the liquid reaction product was filtered to remove the charcoal and the palladium (II) catalyst.

Reduced pressure was then imposed on the filtered reaction product at room temperature to strip off unreacted ethyl vinyl ether and by-product ethanol.

A yield of 56.2 gm of product with an equivalent weight of 105 grams/equivalent was obtained. An aliquot of this transvinylation reaction product was put aside for subsequent analysis. After about two months, analysis indicated that 8 percent of the trimethylol propane was unreacted, 26 percent was monovinylated, 23 percent was divinylated, and 13 percent was trivinylated. This left about 20 percent of the product unaccounted for, and it is thought that this comprised acetals formed by reaction of hydroxy groups with vinyl groups as the product awaited analysis. It is this intrinsic instability when hydroxy functionality is present which is overcome by reaction of the freshly-formed transvinylation mixture in accordance with this invention prior to substantial acetal formation. As has been discussed, distillation, as used in the prior art, requires elevated temperature which speeds acetal formation.

Substantially the same results are obtained by repeating the above example using 0.5 percent of the palladium (II) catalyst to speed the reaction.

It is stressed that this invention not only minimizes the hydroxy functionality, but it also increases the vinyl functionality of the polyurethane product as well as the total number of urethane and urea groups present therein. With a greater number of vinyl groups per molecule, we decrease the number of molecules lacking vinyl groups and thus decrease the adverse effect of the loss of vinyl unsaturation through, for example, acetal formation. So long as a molecule contains vinyl unsaturation, there is a high probability of its being incorporated into a polymer during the cationic cure, and thus eliminate the presence of unpolymerized acetal-terminated material in the cured product formed by photopolymerization.

EXAMPLE 2

Production of the Polyurethane Composition

An aliquot, i.e., 56.2 gm (0.53 equivalent) of the freshly-formed transvinylated mixture of Example 1 was formed into a vinyl ether-terminated polyurethane composition using about a stoichiometric amount, based on the amount of residual hydroxy groups, of isophorone diisocyanate, i.e. 60 gm of isophorone diisocyanate. In this reaction, the isophorone diisocyanate was added progressively while the reaction proceeded at 50° C. in the presence of 1 percent by weight of dibutyl tin dilaurate. This process was continued until infrared examination indicated the substantial consumption of the hydroxyl peak and the slight presence of the isocyanate peak. This slight amount of excess isocyanate can be ignored, or it can be eliminated by adding about a stoichiometric amount of a polyol, preferably a monofunctional alcohol or a diol, and continuing the reaction until the isocyanate peak disappears.

The polyurethane composition obtained by reaction of the transvinylation mixture with the diisocyanate is a substantially hydroxy-free viscous liquid having a viscosity appropriate for coating.

About 5.5 weight percent, based on the total weight of the polyurethane composition, of the General Electric cationic photoinitiator UVE-1014 was then mixed in to prepare the polyurethane composition for subsequent radiation cure. This provides about 2.75 percent of active photoinitiator, which is more than is presently preferred.

The catalyzed polyurethane composition was then drawn down on a substrate in a thin film having a thickness of 1 mil and cured by exposure to an ultraviolet radiation having a wavelength of about 200 to about 400 nanometers (nm) and to a dosage of about 0.7 Joules per square centimeter. A pulse zenon lamp from IST was utilized to supply the ultraviolet radiation. The resulting cured film was tack-free and tough, and it resisted more than 170 methyl ethyl ketone double rubs. The cured film also resisted fingernail scratching and was visually clear. The usual result of this high proportion of catalyst is a discolored film, but discoloration is hard to see in this very thin film.

Repeating this Example using 0.5 percent by weight of UVE-1016 as the catalyst (50 percent active), and employing 4,4'-diphenylmethane diisocyanate as the diisocyanate, the product could be cured in a film having a thickness of 3 mils using ultraviolet radiation from the pulse zenon lamp having a wavelength of about 200 to about 400 nm and using an exposure of only 0.5 Joules per square centimeter. This allows a much thicker film to be cured more rapidly and the film is tack-free, tough and solvent resistant, and is cured throughout its thickness. Very little discoloration is visible.

EXAMPLE 3

Production of a Transvinylation Polyhydric Alcohol Mixture Using a Polyvinyl Ether Repeating Example 1 but replacing the vinyl ether in the transvinylation reaction with triethylene glycol divinyl ether, removal of volatiles at the termination of the transvinylation reaction is not needed. Thus, the mere removal of catalyst by adding charcoal followed by filtration provides a transvinylation mixture ready for reaction with the diisocyanate. Use of the divinyl ether speeded the transvinylation reaction. A reaction time of 36 hours resulted in about 65 percent hydroxy conversion which is approximately the same hydroxy conversion as achieved in EXAMPLE 1 in 72 hours.

EXAMPLE 4

Comparison of Ultrasonic and Non-Ultrasonic Production of the Transvinylation Polyhydric Alcohol Mixture An experiment was conducted to determine the effect of ultrasonic energy on the transvinylation reaction. Two reactions were conducted in separate vessels. Each vessel contained the following reactants: 30 gm trimethylol propane; 200 ml ethyl vinyl ether; 2.2 gm Pd (II); and 0.12 gm tridecane, a conventional internal standard utilized for gas chromotography. The first vessel was placed in a room temperature water bath. The second vessel was placed in a room temperature water bath of a Model B220 ultrasonic cleaner, commercially available from Branson Corp. This cleaner has 125 watts of power and provides a frequency of about 30 to about 50 kHz. Samples were removed at the sampling times designated in TABLE I, below, and gas chromatography was performed on each sample. The percent hydroxy conversion for the two reactions at specified sampling times is present in TABLE I.

TABLE I

| | PERCENT HYDROXY CONVERSION | | | |
|---|---|---|---|---|
| | Sampling Time (hours) | | | |
| | 2 | 4 | 6 | 23 |
| Reaction Method | Hydroxy Conversion (wt %) | | | |
| non-ultrasonic | 5.0 | 17.5 | 22.4 | 43.1 |
| ultrasonic | 13.6 | 31.1 | 30.4 | 72.5 |

TABLE I shows how the use of ultrasonic energy enhances the transvinylation reaction. The reduction in percent hydroxy conversion for the ultrasonic reaction method between the 4 and 6 hour sampling time is due to experimental error.

EXAMPLE 5

Preparation of a Polyurethane Composition

I. Preparation of Diaceto (1,10-phenanthroline) Palladium (II) Catalyst

All raw materials were technical grade without any further purification. A solution of 5.0 gm [27.7 millimoles (mmol)]of 1,10-phenanthroline dissolved in 250 ml of benzene was added dropwise with stirring to a solution of 4.0 gm of palladium diacetate (17.8 mmol) in 250 ml of benzene at room temperature. A bright yellow solid precipitated from the solution. After 3 hours the solid was isolated by filtration. The precipitate was washed with 200 ml of benzene, and 400 ml of petroleum ether and then dried at reduced pressure overnight. The yield of pale yellow solid was 7.20 g (17.8 mmol; 100%).

II. Transvinylation Reaction

A mixture of 22.4 gm (0.167 mol; 0.5 hydroxy equivalents) of trimethylol propane and 27.5 gm (0.05 hydroxy equivalent) of Duracarb-122 polycarbonate diol (PPG) was heated at 60 C for 30 minutes in a 500 ml three-necked flask equipped with a mechanical stirrer. At the end of the 30 minute time period a clear solution was obtained to which was added 300 gm (2.73 mol) of triethylene glycol divinyl ether (DVE-3, commercially available from GAF was uthlyed) with stirring. When the temperature decreased to 40 C, 2.3 gm (5.7 mmol) of the diaceto (1,10-phenanthroline) palladium (II) was added. The transvinylation reaction was then carried out at room temperature for 36 hours. During this time the reaction appearance gradually changed from a light yellow heterogeneous mixture to a dark brown homogeneous solution. Since no by-products were generated, the reaction time was estimated from the previously run model reaction studies of trimethylol propane and ethyl vinyl ether. It is estimated that at least 65% transvinylation was achieved in this time period.

The filtration method, a chromatography procedure, used to remove the Pd (II) catalyst involved a 5 inch by 1.5 inch silica gel column having a 70 to 230 U.S. Sieve Series mesh and a pH neutral surface with a 0.5 inch layer of activated carbon (G-60, commercially available from Darco), on the top. The column was wetted with DVE-3, then the reaction mixture was poured through. The first 100 ml of eluent was discarded and the rest of the eluent is then collected to give about 320 gm (90% product) of transvinylation mixture as a very light yellow liquid. Except for the removal of the catalyst, no further purification is necessary.

III. Urethane Vinyl Ether Oligomer

The transvinylation mixture (114.4 gm; 0.18 hydroxy equivalents, theoretical) was charged into a 500 ml round bottom flask along with 30.7 gm (0.123 mol) of diphenylmethane diisocyanate (a 2,4'- and 4,4'mixture). While stirring, 1.4 gm of dibutyl tin dilaurate was added as a catalyst at room temperature. An exothermic reaction resulted and the temperature increased immediately to 50.C, then decreased slowly. After 3 hours stirring at room temperature, a sample was examined for isocyanate groups by infra-red spectroscopy. When all the isocyanate was consumed (about 6 to 8 hours) the reaction was terminated and nearly 100% of oligomer is obtained.

This invention has been described in terms of specific embodiments set forth in detail, but it should be understood that these ar by way of illustration only and that the invention is not necessarily limited thereto. Modifications and variations will be apparent from the disclosure and may be resorted to without departing from the spirit of the invention, as those skilled in the art will readily understand. Accordingly, such variations and modifications of the disclosed products are considered to be within the purview and scope of the invention and the following claims.

We claim:

1. A cationically curable polyurethane composition comprising the reaction product of an organic polyisocyanate with a transvinylation polyhydric alcohol mixture containing hydroxy groups that is the transvinylation reaction product of (1) at least one vinyl ether and (2) at least one polyhydric alcohol having an average of more than 2 hydroxy groups per molecule, with the polyisocyanate consuming substantially all of the available hydroxy groups of the transvinylation mixture.

2. The composition in accordance with claim 1 wherein the polyhydric alcohol contains at least about 3 to about 90 percent by weight of unreacted polyhydric alcohol.

3. The composition in accordance with claim 1 wherein the polyhydric alcohol is transvinylated to react from 30 to 80 percent of the hydroxy groups thereon.

4. The composition in accordance with claim 1 wherein the polyisocyanate is a diisocyanate and the polyurethane has a vinyl ether functionality in excess of 2.1.

5. The composition in accordance with claim 2 wherein the diisocyanate is a bisphenylalkane diisocyanate in which the alkane group contains 1 to 8 carbon atoms.

6. The composition in accordance with claim 1 wherein the polyhydric alcohol has an average of 3 or more hydroxy groups per molecule.

7. The composition in accordance with claim 6 wherein the polyhydric alcohol has up to an average of about 10 hydroxy groups per molecule.

8. The composition in accordance with claim 1 wherein the polyhydric alcohol contains 2 to about 10 carbon atoms.

9. The composition in accordance with claim 1 wherein the polyhydric alcohol contains 3 to about 6 carbon atoms.

10. The composition in accordance to claim 1 wherein the vinyl ether has the formula:

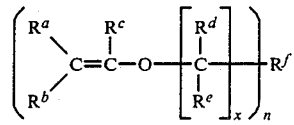

wherein $R^a$, $R^b$, $R^c$, $R^d$, and $R^e$ are each independently selected from the group of hydrogen and lower alkyl containing 1 to 4 carbon atoms and $R^a$ or $R^b$ and $R^c$ can be joined together to form part of a ring structure, $R^a$ or $R^b$ and $R^d$ or $R^e$ can be joined together to form part of a ring structure and $R^c$ and $R^d$ or $R^e$ can be joined together to form part of a ring structure, $R^f$ is an aromatic or aliphatic group that is only reactive at the site(s) where a vinyl ether containing radical is bound, x is equal to 0 or 1 and n is equal to 1 to 10 with the proviso that n is less than or equal to the number of reactive sites of $R^f$.

11. The composition in accordance with claim 10 wherein $R^f$ contains 1 to about 20 atoms, contains at least one carbon atom, and can contain heteroatoms and n is equal to 1 to 4.

12. The composition in accordance with claim 11 wherein $R^f$ contains 1 to about 10 atoms.

13. The composition in accordance with claim 10 wherein $R^f$ is a straight or branched carbon containing group containing 1 to about 8 atoms and can contain at least one oxygen atom and n is 1 to about 4.

14. The composition in accordance with claim 13 wherein $R^f$ contains 1 to about 4 atoms.

15. The composition in accordance with claim 1 wherein the vinyl ether has the formula:

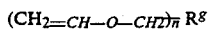

wherein $R^g$ is an aliphatic group that is only reactive at the site(s) where a vinyl ether containing radical is bound and n is equal to 1 to 4 with the proviso that n is less than or equal to the number of reactive sites of $R^g$.

16. The composition in accordance with claim 1 wherein the transvinylated mixture contains 3 to 25 weight percent of unreacted polyhydric alcohol, 30 to 94 weight percent of partially transvinylated alcohol and 3 to 25 weight percent of fully transvinylated alcohol.

17. The composition in accordance with claim 1 wherein the equivalent ratio of vinyl ether to polyhydric alcohol for the transvinylation reaction is in the range of about 0.5:1 to about 5:1.

18. The composition in accordance with claim 17 wherein the equivalent ratio is about 0.8:1 to about 2:1.

19. The composition in accordance with claim 1 can further include amine functionality and wherein the equivalent ratio of hydroxy, and/or amine functionality to isocyanate is up to about 1.2:1.

20. The composition in accordance with claim 1 wherein the transvinylation mixture is produced by subjecting an admixture of vinyl ether and polyhydric alcohol to ultrasonic energy for a time period effective to produce the transvinylation mixture.

21. A cationically curable polyurethane composition comprising the reaction product of an organic diisocyanate with a transvinylation polyhydric alcohol mixture containing hydroxy groups that is the transvinylation reaction product of (1) a vinyl ether having the formula:

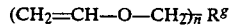

wherein $R^g$ is an aliphatic group that is only reactive at the site(s) where a vinyl ether containing radical is bound and n is equal to 1 to 4 with the proviso that n is less than or equal to the number of reactive sites of $R^g$ and (2) at least one aliphatic polyhydric alcohol containing 2 to about 10 carbon atoms and having an average of 3 or more hydroxy groups per molecule, wherein the diisocyanate consumes substantially all of the available hydroxy groups of the transvinylation mixture and the equivalent ratio of vinyl ether to polyhydric alcohol is in the range of about 0.5:1 to about 5:1.

22. The composition in accordance with claim 21 wherein the polyurethane has an average vinyl ether functionality in excess of 2 groups per polyurethane molecule.

23. The composition in accordance with claim 21 wherein the polyhydric alcohol contains 3 to about 6 carbon atoms.

24. The composition in accordance with claim 21 wherein $R^g$ contains 1 to about 4 atoms.

25. The composition in accordance with claim 21 wherein the equivalent ratio is about 0.8:1 to about 2:1.

26. The composition in accordance with claim 21 wherein the transvinylated mixture contains 3 to 25 weight percent of unreacted polyhydric alcohol, 30 to 94 weight percent of partially transvinylated alcohol and 3 to 25 weight percent of fully transvinylated alcohol.

27. A method of producing a transvinylated aliphatic polyhydric alcohol mixture comprising subjecting an admixture of a vinyl ether and an aliphatic polyhydric alcohol to ultrasonic energy for a time period effective to produce a transvinylated polyhydric alcohol mixture.

28. The method in accordance to claim 27 wherein the ultrasonic energy has a frequency of about 10 to about 850 kHz.

29. The method in accordance with claim 27 wherein the transvinylated mixture contains 3 to 25 weight percent of unreacted polyhydric alcohol, 30 to 94 weight percent of partially transvinylated alcohol and 3 to 25 weight percent of fully transvinylated alcohol.

30. The method in accordance with claim 27 wherein the equivalent ratio of vinyl ether to polyhydric alcohol for the transvinylation reaction is in the range of about 0.5:1 to about 5:1.

31. The method in accordance with claim 30 wherein the equivalent ratio is about 0.8:1 to about 2:1.

32. The method in accordance with claim 27 wherein the equivalent ratio of hydroxy, and/or amine functionality, to isocyanate is up to about 1.2:1.

33. A method of producing a cationically curable polyurethane composition comprising the steps of:
(a) reacting an admixture of a vinyl ether, an polyhydric alcohol having an average of more than 2 hydroxy groups per molecule and a catalyst by subjecting the admixture to ultrasonic energy for a time period effective to produce a transvinylation polyhydric alcohol mixture containing hydroxy groups; and
(b) reacting a polyisocyanate with the reaction product of step (a), to consume substantially all of the available reactive groups in the transvinylation mixture.

34. The method in accordance to claim 33 wherein the ultrasonic energy has a frequency of about 10 to about 850 kHz.

35. The method in accordance with claim 33 wherein the transvinylated mixture contains 3 to 25 weight percent of unreacted polyhydric alcohol, 30 to 94 weight percent of partially transvinylated alcohol and 3 to 25 weight percent of fully transvinylated alcohol.

36. The method in accordance with claim 33 wherein the equivalent ratio of vinyl ether to polyhydric alcohol for the transvinylation reaction is in the range of about 0.5:1 to about 5:1.

37. The method in accordance with claim 36 wherein the equivalent ratio is about 0.8:1 to about 2:1.

38. The method in accordance with claim 33 wherein the equivalent ratio of hydroxy, and/or amine functionality, to isocyanate is up to about 1.2:1.

* * * * *